(12) United States Patent
Booth et al.

(10) Patent No.: US 6,512,417 B2
(45) Date of Patent: Jan. 28, 2003

(54) LINEAR AMPLIFIER ARRANGEMENT

(75) Inventors: Andrew Booth, Hertfordshire (GB);
Howard Smith, Hertfordshire (GB);
David Lewsey, Saffron Walden (GB);
Scott Widdowson, Harlow (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/853,858

(22) Filed: May 11, 2001

(65) Prior Publication Data

US 2002/0041210 A1 Apr. 11, 2002

(30) Foreign Application Priority Data

May 11, 2000 (GB) ............................................. 0011326

(51) Int. Cl.$^7$ ................................................ H03F 1/26
(52) U.S. Cl. ...................................... 330/149; 330/136
(58) Field of Search ................................ 330/149, 136, 330/2

(56) References Cited

U.S. PATENT DOCUMENTS

| | | | | |
|---|---|---|---|---|
| 5,742,201 A | * | 4/1998 | Eisenberg et al. | ............. 330/2 |
| 5,760,646 A | * | 6/1998 | Belcher et al. | ............. 330/149 |
| 5,867,065 A | * | 2/1999 | Leyendecker | ............... 330/149 |
| 5,892,397 A | * | 4/1999 | Belcher et al. | ............. 330/136 |
| 5,929,704 A | * | 7/1999 | Proctor et al. | ............. 330/149 |
| 6,075,411 A | * | 6/2000 | Briffa et al. | ................ 330/149 |
| 6,091,298 A | * | 7/2000 | McNicol et al. | ............ 330/149 |
| 6,275,685 B1 | * | 8/2001 | Wessel et al. | ............... 330/149 |

* cited by examiner

*Primary Examiner*—Robert Pascal
*Assistant Examiner*—Khanh Van Nguyen
(74) *Attorney, Agent, or Firm*—Lee, Mann, Smith, McWilliams, Sweeney & Ohlson

(57) ABSTRACT

An amplifier arrangement comprising an amplifier for amplifying an input radio frequency (RF) signal to generate an output RF signal. A linear function processor generates a linear function correction signal which is a linear function of previous samples of the input signal in order to compensate for distortion effects of the amplifier related to the history of the input signal. A non-linear function processor generates a non-linear function of the input signal in order to compensate for instantaneous distortion effects of the amplifier. Then a pre-distortion processor distorts the current input signal in accordance with the linear and nonlinear function correction signals in order to compensate for both types of distortion in the output signal.

68 Claims, 10 Drawing Sheets

LINEAR AMPLIFIER ARRANGEMENT

FIELD OF THE INVENTION

This invention relates to high power linear amplifiers and in particular relates to the same using digital pre-distortion.

BACKGROUND OF THE DRAWINGS

First and second generation cellular systems have historically used forms of modulation which are either constant envelope (e.g. GMSK in GSM) or which result in relatively low levels of amplitude modulation. The linearity of the high power amplifiers used for such systems has therefore not been an important technical issue; indeed, for the constant envelope systems it is standard practice to operate the amplifiers either close to or actually in compression in order to maximise power efficiency.

Third generation cellular systems however typically use linear spread-spectrum modulation schemes with a large amount of amplitude modulation of the signal envelope. When passed through a high power amplifier, the output is typically distorted in amplitude and phase by the non-linearity of the amplifier: the amplitude and phase distortion effects are commonly referred to as AM-AM conversion and AM-PM conversion respectively. Both distortion effects are a function only of the amplitude envelope of the input signal and are insensitive to the input phase envelope.

In systems such as Code Division Multiple Access (CDMA) modulation schemes, a plurality of signals are transmitted in a communication system and are amplified simultaneously. When a plurality of signals are applied to a linear amplifier, its non-linear characteristics will tend to produce interaction between the signals being amplified and the amplifier output will contain intermodulation products. Such intermodulation products reduce signal quality by allowing cross-talk to occur and such spillage often falls outside a particular licensed spectrum and must be controlled. Such intermodulation distortion can be reduced by negative feedback of the distortion components, pre-distortion of the signal to be amplified to cancel the amplifier generated distortion, or by separating the distortion components with the amplifier output and feeding forward the distortion component to cancel the distortion of the amplifier output signal.

There are many ways of linearising a high power amplifier: direct RF feedback, envelope feedback, feed-forward and pre-distortion. For cellular power amplifiers, feed-forward amplifiers are commonly used. Feed forward amplifiers are more complicated in that they require the modification of the separated distortion component in amplitude and phase to match the gain and phase shift of the amplifier on a continuous basis and require an error amplifier which is typically similar in power handling to the main amplifier which incurs a heavy penalty in RF device cost and power efficiency.

Envelope feedback methods (polar and Cartesian) perform much better than feed-forward amplifiers in terms of device cost and efficiency since the RF signal linearistaion processing is done before the power amplifier on a small signal. However, envelope feedback is fundamentally limited in the correction bandwidth obtainable by the delay of the feedback loop. As systems migrate to wider band modulation (e.g. CDMA2000 and WCDMA) a linearisation technology is required which is fundamentally a wideband technique.

Most implementations of pre-distortion are inherently wideband, however the performance achievable has been limited by the difficulty of matching the complex distortion characteristics of typical power amplifier devices with simple analogue pre-distortion networks.

U.S. Pat. No. 4,700,151 (Nagata) provides a baseband (analogue or digital) modulation system and technique which employs a look-up table for adaptation. U.S. Pat. No. 5,049,832 (Cavers) provides a digital pre-distortion arrangement which reduces memory requirements to under 100 complex pairs, with a resultant reduction in convergence time and removes the need for a phase shifter or PLL in a feedback path.

The applicant's U.S. patent application Ser. No. 09/209,386 filed on Dec. 10, 1998 provides a method of linearising a power amplifier by pre-distorting the input to correct for the instantaneous non-linear transfer function of a power amplifier. The input is split into two paths. The main path goes through a delay line into a modulator and then into an amplifier. The second signal is sent to an amplitude detector whose output is converted into a digital number and used to address a look-up table. The look-up table output is converted into an analogue signal which is used to modulate the main signal such that the power amplifier is linearised. Although this does reduce unwanted emissions out of the licensed bandwidth, further reductions without incurring much extra cost are desirable.

OBJECT OF THE INVENTION

The present invention seeks to provide an improved linear amplifier arrangement which achieves correction over a wide bandwidth with low system cost and high efficiency. More particularly the present inventIon seeks to provide a linear amplifier arrangement capable of amplifying and combining a number of frequency carriers or bearers.

SUMMARY OF THE INVENTION

According to a first aspect of the present invention there is provided an amplifier arrangement comprising:

an amplifier for amplifying an input radio frequency (RF) signal to generate an output RF signal;

a linear function processor for implementing a linear function of previous samples of the input signal to generate a linear function correction signal; and a pre-distortion processor for distorting the current input signal in accordance with the linear function correction signal in order to compensate for distortion in the output signal.

As well has exhibiting instantaneous amplitude and/or phase distortion effects a power amplifier will generally exhibit distortion effects based on the past history of the input signal. For example amplitude and/or phase distortion in the amplifier may be different when the input sample has just undergone a rapid reduction in amplitude than when the input signal has just undergone a rapid increase in amplitude. These historical distortion effects can be greatly reduced while adding little extra cost to the amplifier arrangement by applying a pre-distortion to the input signal based on a linear function of past samples of the input signal.

It should be noted that the pre-distortion processor may take into account other inputs than the linear function when distorting the input signal.

The linear function processor may by a finite impulse response filter and the linear function may have the form:

$$g(t) = \sum_{K=0}^{N} h(k)|x(t-k)|$$

where
- g(t) is the linear function,
- h(k) is a scaling factor,
- |x(t−k)| are the previous samples of the input signal, and
- N is the number of previous samples The fact that g(t) is a linear function of the past samples of the input signal |x(t−k)| makes the pre-distortion easy to implement in a cost effective manner. A particularly simple and yet effective implementation is provided when the linear function has the form:

$$h(t) = K(|x(t-2)| - |x(t-3)|)$$

where
- h(t) is the linear function,
- K is a scaling factor,
- |x(t−2)| is the previous sample of the input signal two samples before the current input signal, and
- |x(t−3)| is the previous sample of the input signal three samples before the current input signal.

A linear function processor for implementing this linear function can be formed using three delay lines, a subtractor and a multiplier. This can enable the linear function processor to be implemented in spare space in existing processing hardward already used in other parts of the amplifier arrangement.

Where the memory dependent distortion effects in the amplifier predominantly effect the amplitude of the output signal the linear function processor may be an amplitude linear function processor for generating an amplitude linear function correction signal to compensate for amplitude distortion in the amplifier. Then the pre-distortion processor generates an amplitude correction signal in accordance with the amplitude linear function correction signal and amplitude modulates the input signal with the amplitude correction signal.

Where the memory dependent distortion effects in the amplifier predominantly effect the phase of the output signal, the linear function processor may be a phase linear function processor for generating a phase linear function correction signal to compensate for phase distortion in the amplifier. Then the pre-distortion processor generates a phase correction signal in accordance with the phase linear function correction signal and phase modulates the input signal with the phase correction signal.

Where the memory dependent distortion effects in the amplifier effect the both that amplitude and the phase of the output signal, the linear function processor may comprise an amplitude linear function processor for generating an amplitude linear function correction signal to compensate for amplitude distortion in the amplifier and a phase linear function processor for generating a phase linear function correction signal to compensate for phase distortion in the amplifier. Then the pre-distortion processor generates an amplitude correction signal in accordance with the amplitude linear function correction signal, generates a phase correction signal in accordance with the phase linear function correction signal, amplitude modulates the input signal with the amplitude correction signal and phase modulates the input signal with the phase correction signals.

In a preferred implemuentation the linear function processor comprises:

a first delay line for delaying the input signal by one cycle;
a subtractor for subtracting the delayed input signal from an undelayed input signal;
second and third delay lines for each delaying the subtracted signal by one cycle; and
a multiplier for multiplying the subtracted signal by a scaling factor.

This type of arrangement can enable the linear function processor to be implemented in spare space in existing processing hardward already used for other functions of the amplifier arrangement.

In a more complex, but also more flexible implementation the linear function processor may comprise:

a plurality of delay lines arranged in a series for delaying the input signal successively by one cycle;
a plurality of multipliers for multiplying by a scaling factor a respective one of a plurality of tapped signals, selected from the input signal and the outputs of any one of the delay lines; and
an adder for adding the outputs from the multipliers.

The linear function processor is preferably a digital processor. A part of the input analogue signal to the amplifier is tapped off the main input signal is detected by an envelope detector, filtered and then converted to digital form by an analogue to digital converter. The resulting digital signal is input into the linear function processor. The output from the linear function processor is further processed by the pre-distortion processor and converted into analogue form and then used to modulate the main input signal.

According to a second aspect of the present invention there is provided an amplifier arrangement comprising:

an amplifier for amplifying an input radio frequency (RF) signal to generate an output RF signal;
a linear function processor for implementing a linear function of previous samples of the input signal to generate a linear function correction signal;
a non-linear function processor for implementing a non-linear function of the input signal to generate a non-linear function correction signal; and
a pre-distortion processor for distorting the current input signal in accordance with the linear and non-linear function correction signals in order to compensate for distortion in the output signal.

According to the second aspect of the invention a non-linear function processor is provided for compensating for instantaneous distortion effects in the amplifier. The non-linear function processor may be implemented as a look-up table. In a preferred version the pre-distortion processor distorts the input signal in accordance with a sum of the linear function correction signal and the non-linear function correction signal.

The non-linear function processor preferably provides compensation for amplitude and phase distortion in the output signal and so generates an amplitude non-linear function correction signal for compensating for amplitude distortion and an phase non-linear function correction signal for compensating for phase distortion.

The second aspect of the present invention the same preferred features recited above in relation to the first aspect of the present invention.

According to a third aspect of the present invention there is provided a method of linearising an amplifier for amplifying an input radio frequency (RF) signal to generate an output RF signal, comprising the steps of:

generating a linear function correction signal which is a linear function of previous samples of the input signal; and distorting the current input signal in accordance with the linear function correction signal in order to compensate for distortion in the output signal.

The third aspect of the present invention has the same advantages discussed above in relation to the first aspect of the present invention.

According to a fourth aspect of the present invention there is provided a method of linearising an amplifier for amplifying an input radio frequency (RF) signal to generate an output RF signal, comprising the steps of;

generating a linear function correction signal which is a linear function of previous samples of the input signal;

generating a non-linear function correction signal which is a non-linear function of the input signal; and distorting the current input signal in accordance with the linear and non-linear correction signals in order to compensate for distortion in the output signal.

According to a fifth aspect of the present invention there is provided an amplifier arrangement comprising:

an amplifier for amplifying an input radio frequency (RF) signal to generate an output RF signal;

an error detection processor responsive to the input signal and the output signal for generating an error correction signal which represents a difference between the input and output signals due to distortion in the amplifier, an adaptive linear function processor responsive to the error correction signal for implementing a linear function of previous samples of the input signal to generate a linear function correction signal; and a pre-distortion processor for distorting the current input signal in accordance with the linear function correction signal in order to compensate for distortion in the output signal.

Preferably, the linear function has the form:

$$g(t) = \sum_{K=0}^{N} h(k)|x(t-k)|$$

where g(t) is the linear function, h(k) is a scaling factor,

|x(t–k)| are the previous samples of the input signal, and

N is the number of previous samples, and additionally comprises a digital signal processor for generating the scaling factors in response to the error correction signal from the error detection processor in accordance with a means squared error form of adaptation.

According to a sixth aspect of the present invention there is provided a method of linearising an amplifier arrangement for amplifying an input radio frequency (RF) signal to generate an output RF signal comprising the steps of;

generating an error correction signal which represents a difference between the input and output signals due to distortion in the amplifier in response to the input signal and the output signal, adaptively implementing in response to the error correction signal a linear function of previous samples of the input signal to generate a linear function correction signal; and pre-distorting the current input signal in accordance with the linear function correction signal in order to compensate for distortion in the output signal.

BRIEF DESCRIPTION OF THE DRAWINGS

In order that the present invention can be more fully understood and to show how the same may be carried into effects, reference shall now be made, by way of example only, to the figures as shown in the accompanying drawing sheets wherein.

DETAILED DESCRIPTION OF THE PREFERRED EMBODIMENTS

There will row be described by way for example the best mode contemplated by the inventors for carrying out the invention In the following description, numerous specific details are set out in order to provide a complete understanding of the present invention. It will be apparent, however, to those skilled in the art that the present invention may be put into practice with variations of the specific.

Figure 1A:
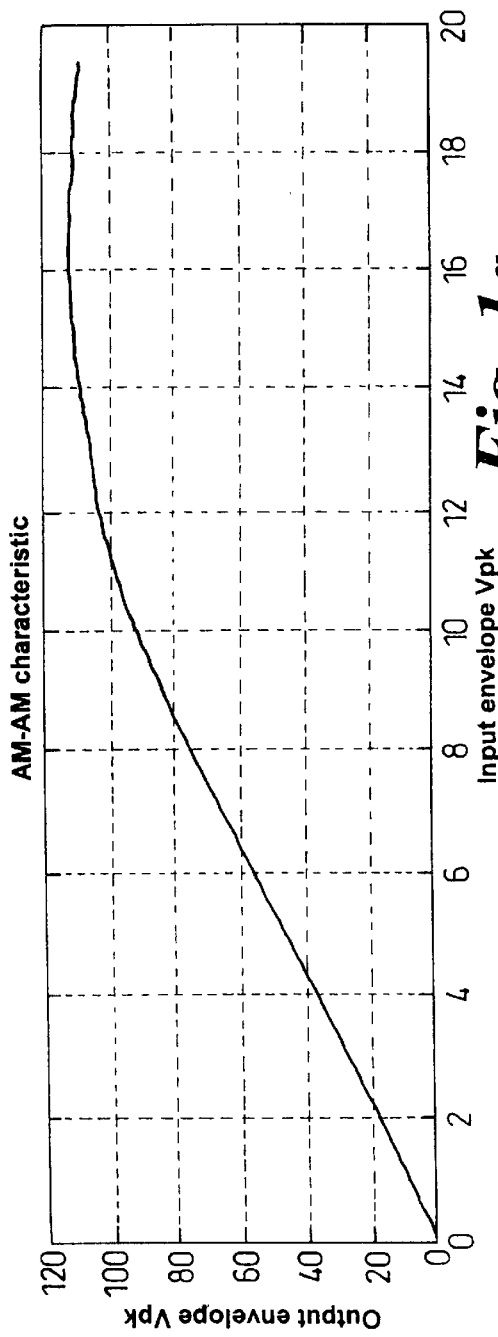
FIGS. 1a–d show graphs relating to amplifier performance.
Figure 1B:
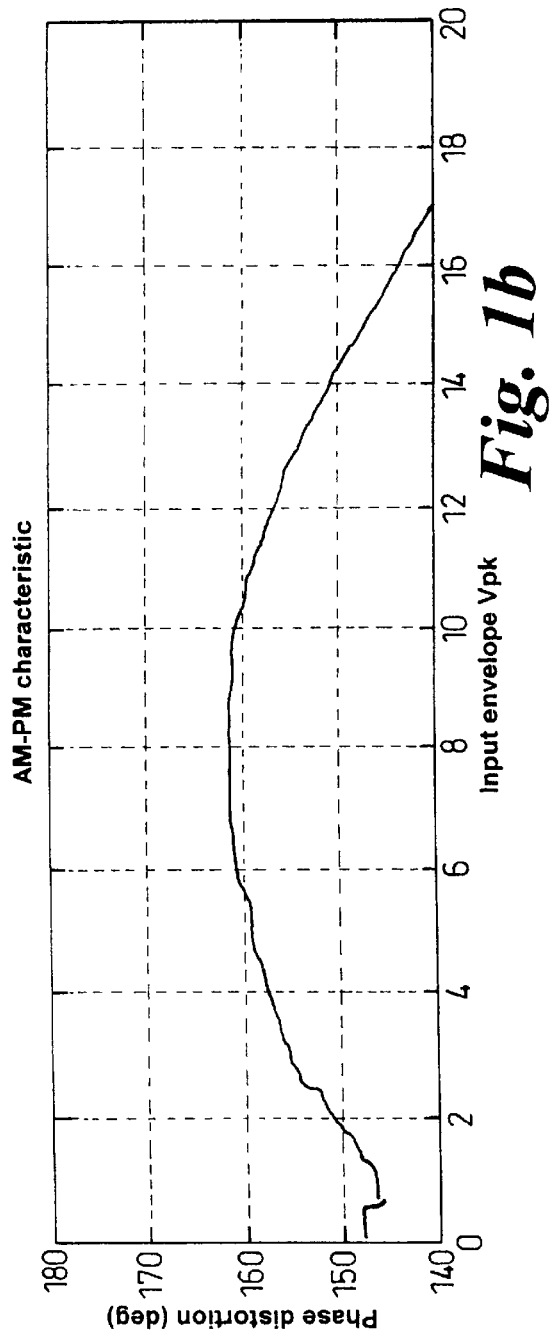

FIGS. 1a and 1b show the amplitude and phase distortion characteristics of a typical class AB power amplifier. FIG. 1a gives the output signal envelope in volts as a function of the input signal envelope in volts, showing the characteristic amplitude compression as the amplifiers nears its saturated output power. FIG. 1b gives the phase shift through the power amplifier as a function of the input signal amplitude envelope.

Figure 1C:
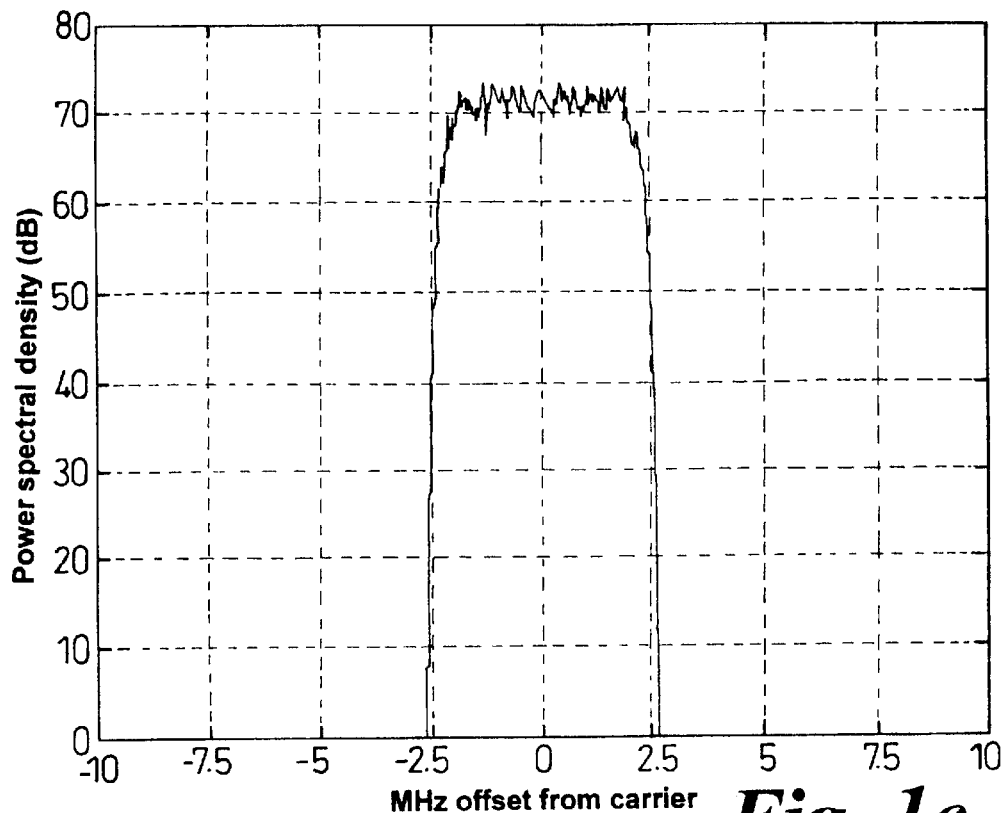
Figure 1D:
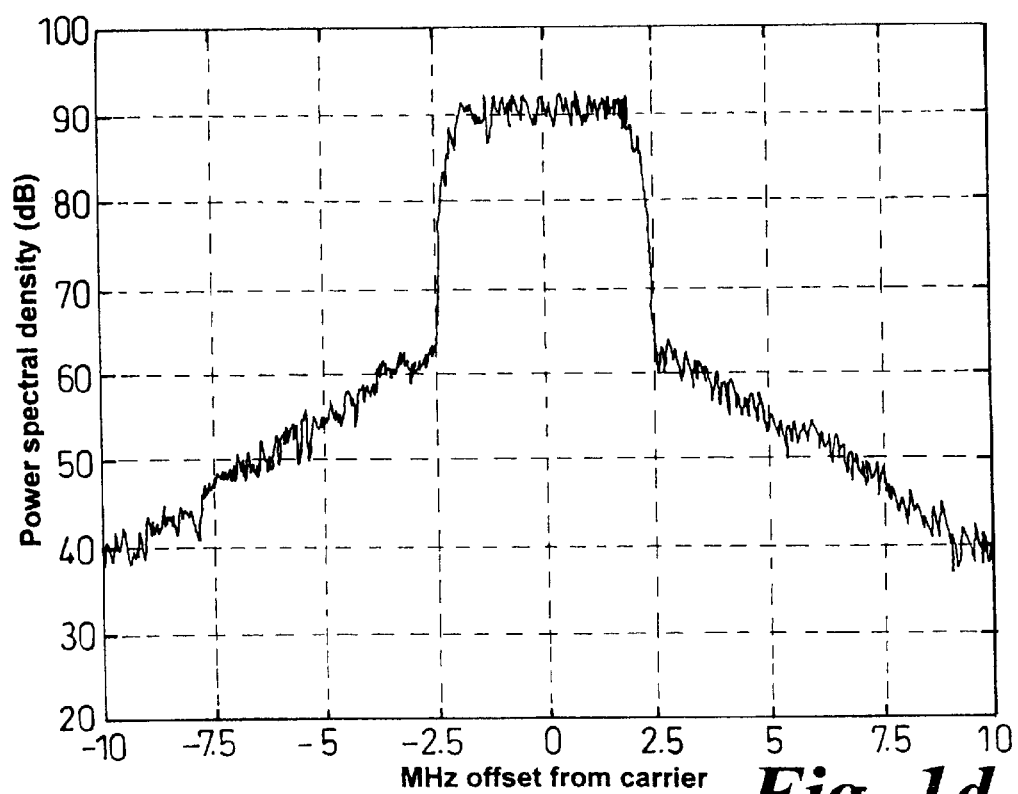

The effect of amplifier distortion on a spread-spectrum modulated signal is illustrated in FIGS. 1c and 1d. FIG. 1c shows the power spectrum of a 20 channel Quadrature Phase Shifting Keying (QPSK) signal applied to the power amplifier input, whilst FIG. 1d shows the resulting power spectrum at the amplifier output. The spectrum has developed sidebands, termed "regrowth sidebands" which are characteristic of amplifier distortion. Regrowth sidebands are a system problem since they can potentially interfere with neighbouring communication channels. Specification limits on regrowth sidebands are therefore stringently specified in most cellular communication standards.

Figure 2:
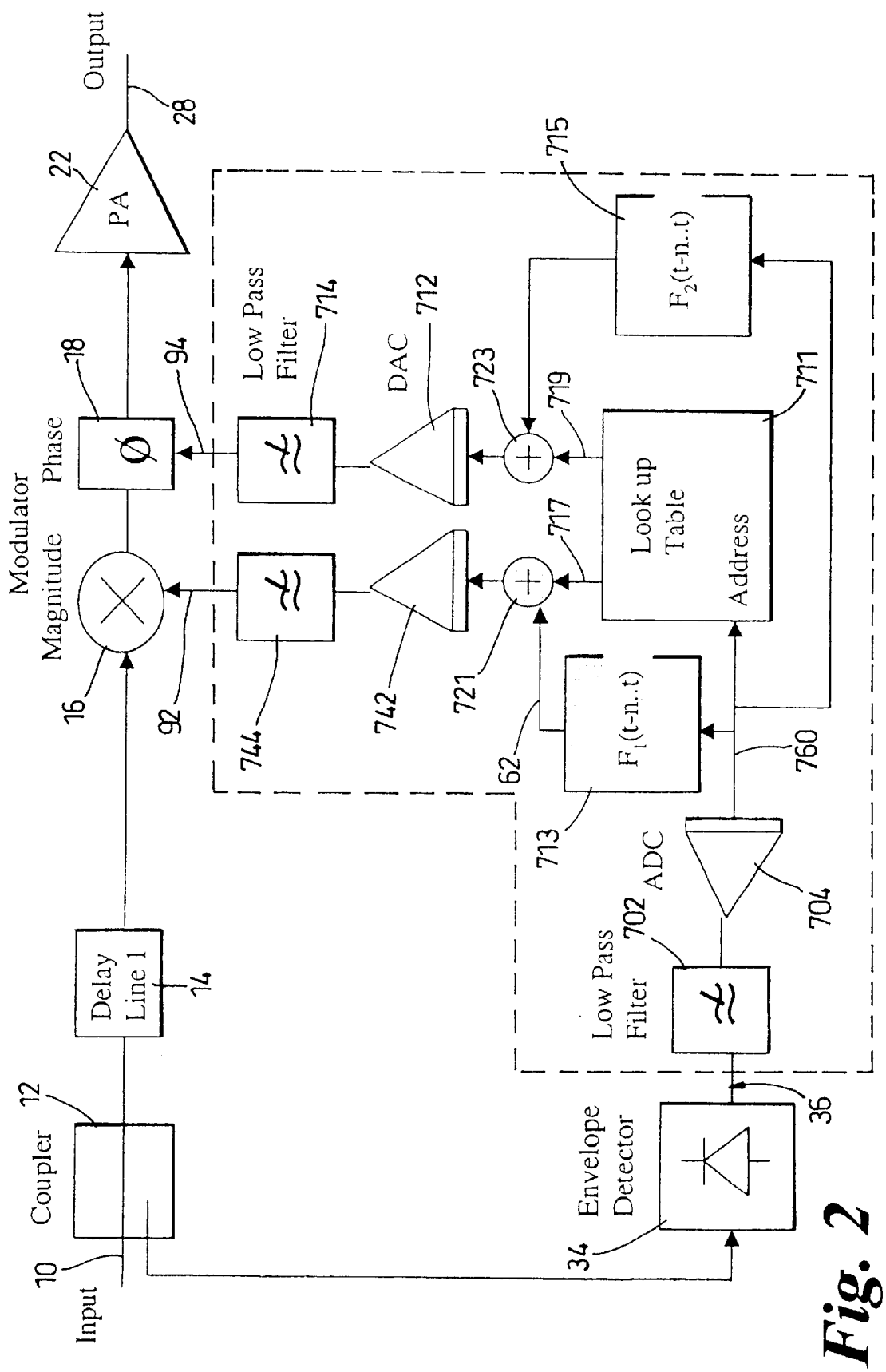
FIG. 2 shows an amplifier arrangement in accordance with a first embodiment of the present invention.

FIG. 2 shows a block diagram of a first embodiment made in accordance with the present invention. In use an RF input signal (10) is applied to a high power amplifier (22) via a directional coupler (12), a first delay line (14), an amplitude modulator (16) and a phase modulator (18). The sampled RF output from the directional coupler (12) is applied to an envelope detector (34). The output of the envelope detector is connected to a digital pre-distortion sub-system (70) the extent of which as denoted by a dotted line in FIG. 2. The pre-distortion sub-system (70) generates two output: an amplitude correction signal (92) which is connected to the control port of amplitude modulator (16); and a phase correction signal (94) which is connected to the control port of the phase modulator (18) The delay line (14) compensates for the delay between the input signal (10) and the amplitude and phase correction signals (92, 94) at the respective modulators (16, 18) due to the processing delay in generating the correction signals.

The pre-distortion sub-system (70) generates the correction signals (92, 94) as functions of input (36) from the envelope detector (34) in such a way that the input signal (10), delayed by delay line (14) and modulated by modulators (16, 18), on passing through the high power amplifier (22) emerges with lower distortion that if no pre-distortion sub-system (70) had been employed. The pre-distortion gain and phase transfer functions of the sub-system (70) are designed to cancel the gain and phase distortion produced by the power amplifier (22).

Figure 7:
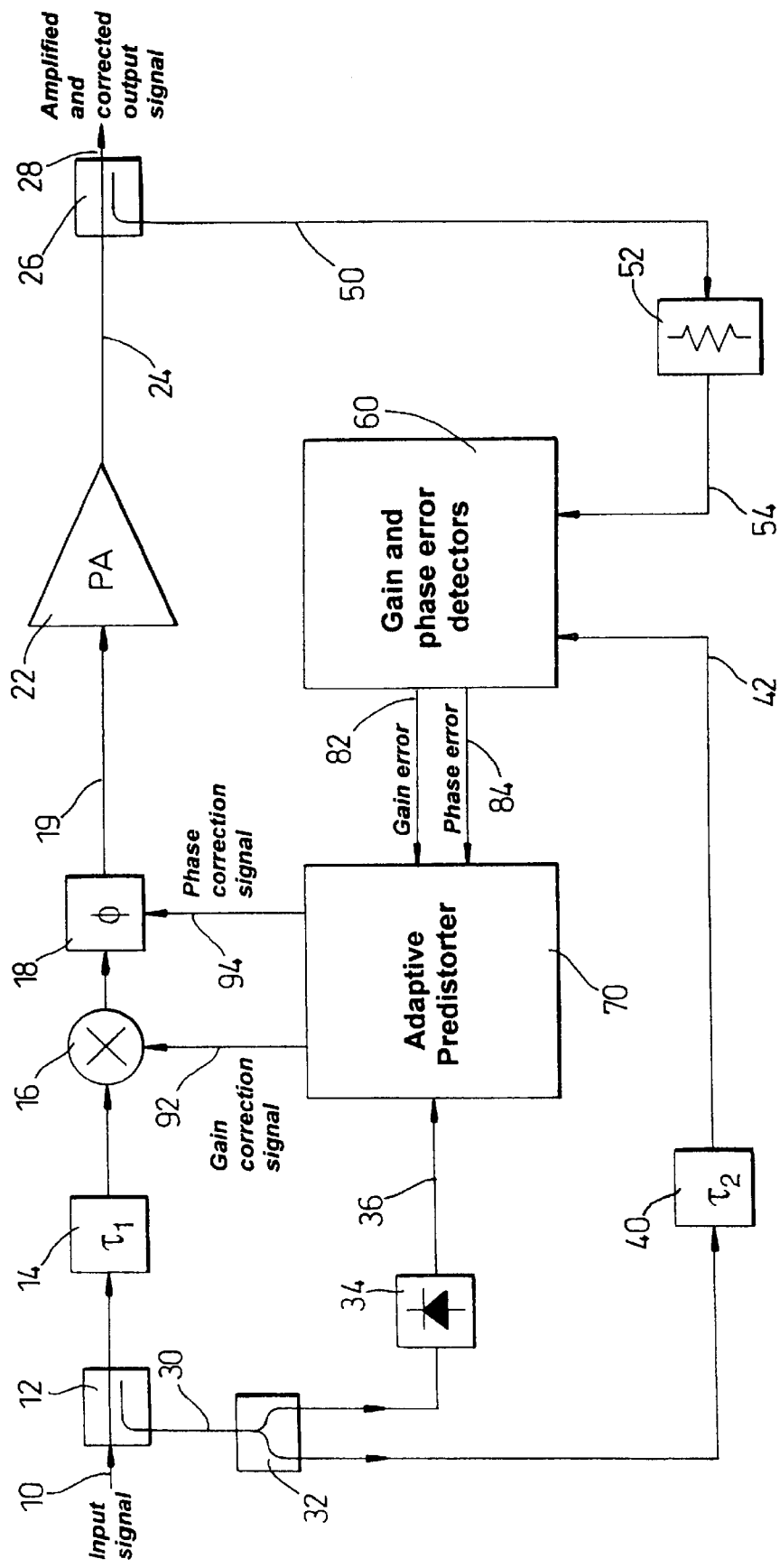
FIG. 7 shows an amplifier arrangement in accordance with a second embodiment of the present invention for providing adaptive pre-distortion.

The signal (36) from the envelope detector (34) is proportional to the amplitude envelope of the system input (10) and is filtered by a low pass anti-alias filter (702) and is digitised by an analogue to digital converter (ADC) (704). The m-bit output of the ADC (704) is connected to the m-bits of an address bus (760). The address bus (760) is used to select an address in look up table (LUT) (711) which comprises a $2^m$ amplitude correction random access memory RAM and a $2^m$ phase correction (RAM). The output (717) of the amplitude correction RAM of the LUT (711) provides a non-linear output dependent on the input (36) which compensates for instantaneous amplitude distortion in the power amplifier (22). The output (719) of the phase correction RAM of the LUT (711) provides a non-linear output dependent on the input (36) which compensates for instantaneous phase distortion in the power amplifier (22). The address bus (760) also applies the m-bit output of the ADC (704) to the inputs of an amplitude linear function processor (713) and a phase linear function processor (715). The outputs of the amplitude and phase linear function processors (713, 715) compensate for distortion which is dependent on the past history of the input signal passing through the power amplifier (22). The output of the amplitude linear function processor (713) is added to the output (717) of the amplitude correction RAM at adder (721) and the resulting m-bit digital signal is converted into an analogue signal by digital to analogue converter (DAC) (742) and the output from the DAC is filtered by a low pass anti-alias filter (744) to give amplitude correction signal (92). The output of the phase linear function processor (715) is added to the output (719) of the phase correction at adder (723) and the resulting m-bit digital signal is converted into an analogue signal by DAC (712) and the output from the DAC is filtered by a low pass anti-alias filter (714) to give phase correction signal (94). The linear function processors (713, 715) may be implemented as finite impulse response (FIR) filters, for example, as shown in FIG. 7.

The compensation provided by the LUT (711) is based on the assumption that the non-linearity of the power amplifier (22) behaves as:

$$y(t) \approx f(|x(t)|) \cdot x(t)$$

Where
y(t) is the amplifier output (28) at time t
x(t) is the input (10) at time t
|x(t)| is tie complex modulus of the input (envelope)
f(|x(t)|) is a non-linear function of the complex modulus of the input The real distortion produced by the power amplifier (22) depends upon both the current input (instantaneous) and the past history of inputs and so a better model of the behaviour of the power amplifier is represented by tie relationship:

$$y(t) = h(|x(-\infty \text{ to } t)|) \cdot x(t)$$

where
y(t) is the output of the power amplifier (22) at time t
|x(−∞ to t)| is the envelope values up to time t
h(x) is a non-linear function of x(t) over all its history, generally a Volterra series.

The pre-distortion sub-system (70) according to the present invention takes into account the memory component of h(x) and provides better performance without adding much complexity.

Assuming that the distortion including memory effects in the power amplifier (22) behaves approximately as:

$$y(t) \approx f(|x(t)|) \cdot h_a(t) * |x(t)| \cdot exp(j \cdot h_p(t) * |x(t)|) \cdot x(t)$$

where $h_a(t)$ and $h_p(t)$ are the impulse responses of the amplitude and phase memory characteristics and * denotes convolution. The impulse response of a function is the output of the function when the input to the function is an impulse, with an impulse defined as a signal having a value of 1 to time 0 and a value of 0 at all other times. The dominant component of the non-linearity is the memoryless or instantaneous component f(|x(t)|) and the spurious amplitude and phase modulation due to memory can be approximated by linear functions of previous samples of the input signal envelope (36). This permits a simple correction architecture in which:

the amplitude correction provided by the pre-distortion sub-system (70) has the form $$f_a(|x(t)|) + h_a(t) * |x(t)|$$

the phase correction provided by the pre-distortion sub-system (70) has the form $$f_p(|x(t)|) + h_p(t) * |x(t)|$$

In the above $f_a$ and $f_p$ are the amplitude and phase lookup table functions embodied in the LUT (711), $h_a(t)$ is the impulse response to linear function embodied in the linear function processor (713) for amplitude correction and $h_p(t)$ is the impulse response to linear function embodied in the linear function processor (715) for phase corrections Thus, samples of the envelope |x(t)| of the input (10) which are used to address the LUT (711) to provide non-linear outputs for amplitude and phase correction dependent on the input are also input into the linear functions processors (713, 715).

The outputs from the linear function processors (713, 715) are added to the respective outputs from the LUT (711) to compensate for memory dependent distortion effects in the amplifier (22).

Figure 3A:
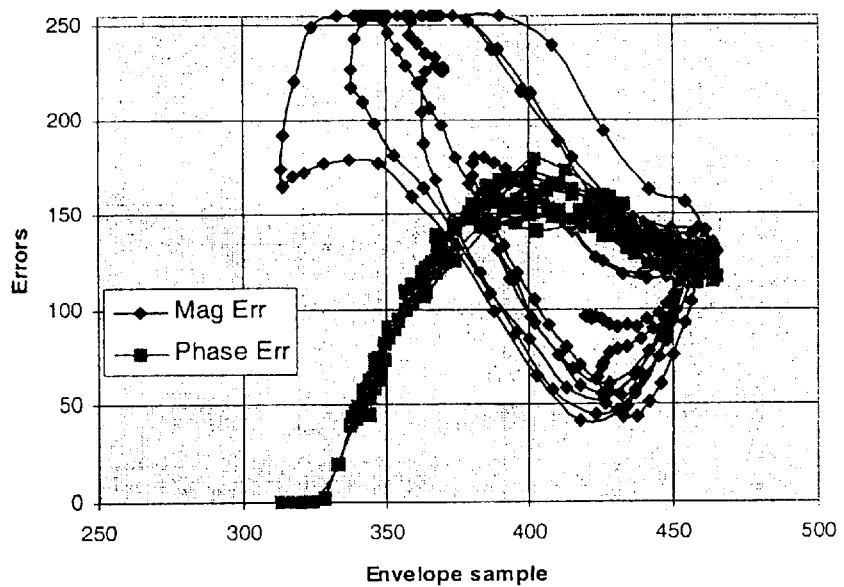
FIG. 3a shows a graph showing amplitude and phase error of a power amplifier to which no pre-distortion correction is applied.

FIG. 3a shows the phase and magnitude errors in the output of a power amplifier vs the envelope of the signal input into the power amplifier where no pre-distortion is applied to the input signal. The errors are calculated to be the actual magnitude and phase component of the output signal minus the respective ideal output signal components expected for a linear amplifier. It can be seen that there are large loops forming the plot of magnitude errors which indicate that there is a memory effect within the power amplifier. If the distortion was memoryless, then for any envelope value (x-axis) the error (y-axis) would be the same, so that the errors follow a single curve. The phase distortion produced by this power amplifier is almost memoryless, as can be seen by the fact that the phase errors lie almost on one curve.

Figure 4A:
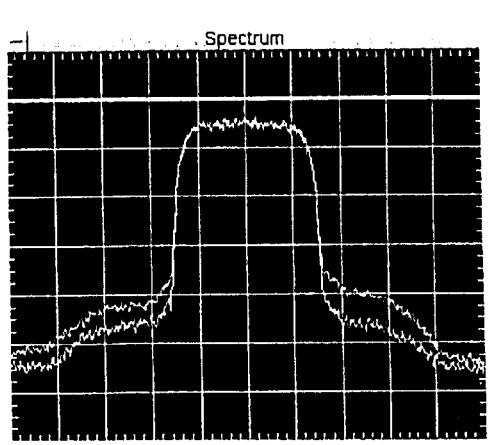
FIG. 4a shows the reduction in adjacent channel power for a power amplifier to which pre-distortion is applied taking into account only instantaneous distortion effects.
Figure 3B:
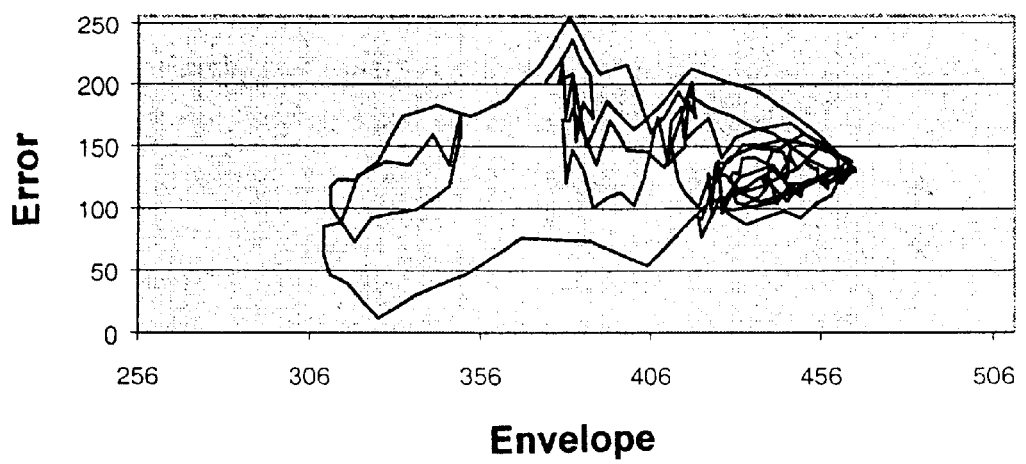
FIG. 3b shows a graph showing amplitude and phase error of a power amplifier to which pre-distortion is applied taking into account only instantaneous distortion effects.
Figure 3B:
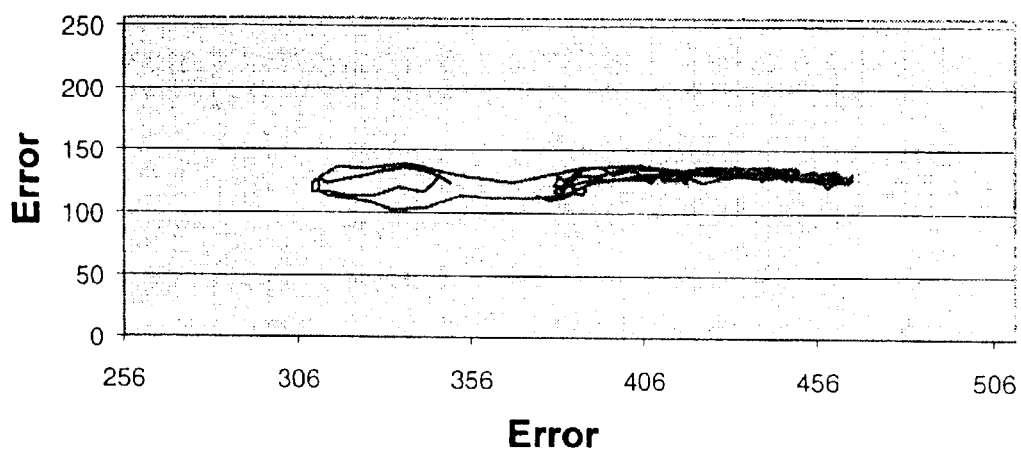

When the input signal (10) is pre-distorted in accordance with non-linear instantaneous distortion function f(x) implemented in the LUT (711) the phase and magnitude errors vs envelope plot shown in FIG. 3b is the result. It can be seen that the magnitude and phase errors become centred around a middle value of 128 which value corresponds to no error. However, this correction does not reduce the loops that are still evident in the magnitude error plot. FIG. 4a shows the reduction in the adjacent channel power (ACP). The top line in FIG. 4a shows the spectral splash in the adjacent channels before the power amplifier has been corrected for non-linear instantaneous distortion and the bottom line in FIG. 4a shows the spectral splash in the adjacent channels after the power amplifier has been corrected for non-linear instantaneous distortion. The ACP of the lower channel has been improved by around 3.5 dB and the ACP of the higher channel has been improved by around 5.5 dB.

Figure 5:
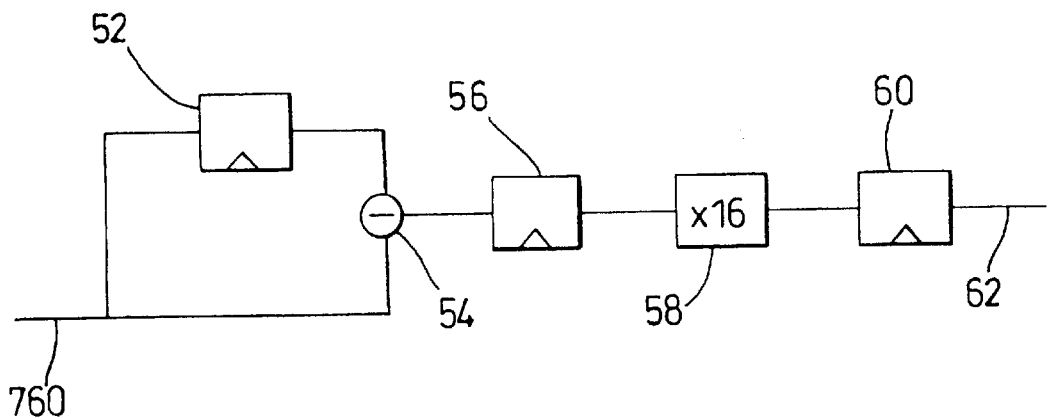
FIG. 5 shows a first implementation of a linear function processor to compensate for memory dependent distortion effects.

The implementation of the linear function processor (713) for correcting the memory dependent distortion in the power amplifier with the error characteristics of FIG. 3a is shown in FIG. 5. As this amplifier had little memory dependence in its phase distortion, the memory dependent pre-distortion is only applied to correct amplitude distortion. The linear function processor (713) of FIG. 5 can be implemented in a Complex Programable Logic Device (CPLD) and operates to take the difference between two previous values of the envelope and multiply the difference by an appropriate scaling factor. Referring now to FIG. 5, the m-bit digital signal of the envelope |x(t)| from the data bus (760) is split into two arms, the upper of which includes a delay line (52). The two arms come together at a subtractor (54) such that the output of the subtractor (54) is a signal |x(t)|−|x(t−1)|. This signal then undergoes a further delay at delay line (56), so the output of delay line (56) is |x(t−1)|−x(t−2)|. This signal is then multiplied by a factor of K at multiplier (58) to generate an output K(|x(t−1)|−|x(t−2)|. This signal is then delayed by delay line (60) to generate an output (62) of the form:

$$h_a(|x(t)|=K(|x(t-2)|-|x(t-3)|)$$

where $h_a(|x(t)|)$=non-linear (instantaneous) function of current sample t (but a linear function of past samples K=constant scaling factor (=16 for this power amplifier)

|x(t−2)|=envelope 2 clock cycles before the current one.

|x(t−3)|=envelope 3 clock cycles before the current one.

The signal (62) is then added to the magnitude output (717) of the LUT (711) at adder (721) as described above in relation to FIG. 2 to generate an output of the form:

$$f_a(|x(t)|)+K\{|x(t-2)|-|x(t-3)|\}$$

Each of the delay lines (52, 56, 60) delay the signal input into them by one clock cycle of the sub-system (70). The scaling factor of K=16 was found to provide the best results through testing various circuits with different scaling factors K. Also, by using a value of K which is a whole number, the multiplication is easily and cheaply implemented. This means that the circuit of FIG. 5 can be implemented on the spare space in the CPLD that is used to implement the LUT (711) and its related components. The envelope values of |x(t−2)| and |x(t−3)| from two and three sample 3 clock cycles previously, rather than from one and two samples previously were also found to give the best error correction.

Figure 4B:
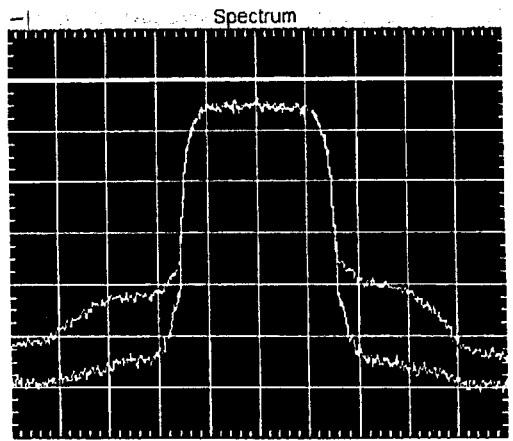
FIG. 4b shows the reduction in adjacent channel power for a power amplifier to which pre-distortion is applied taking into account instantaneous and memory dependent distortion effects.
Figure 3C:
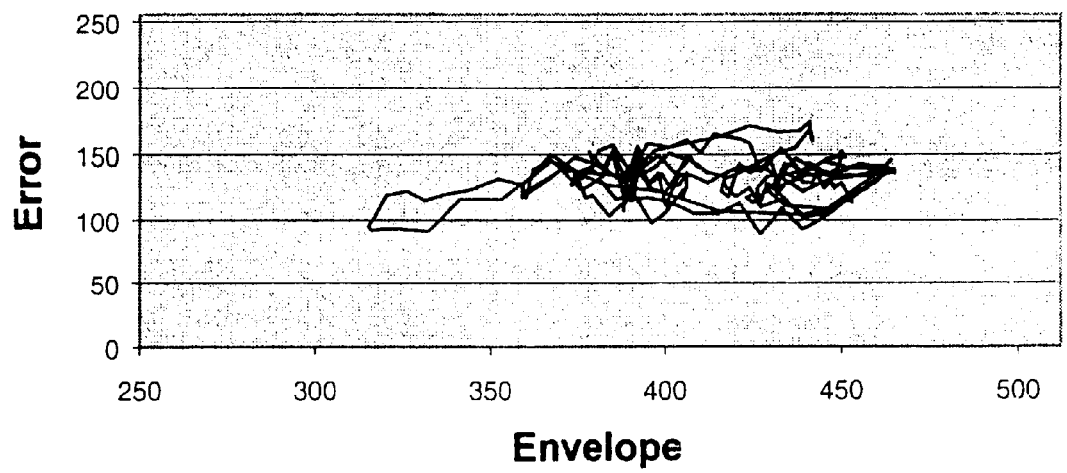
FIG. 3c shows a graph showing amplitude and phase error of a power amplifier to which pre-distortion according to the present invention is applied which takes into account instantaneous and memory dependent distortion effects.
Figure 3C:
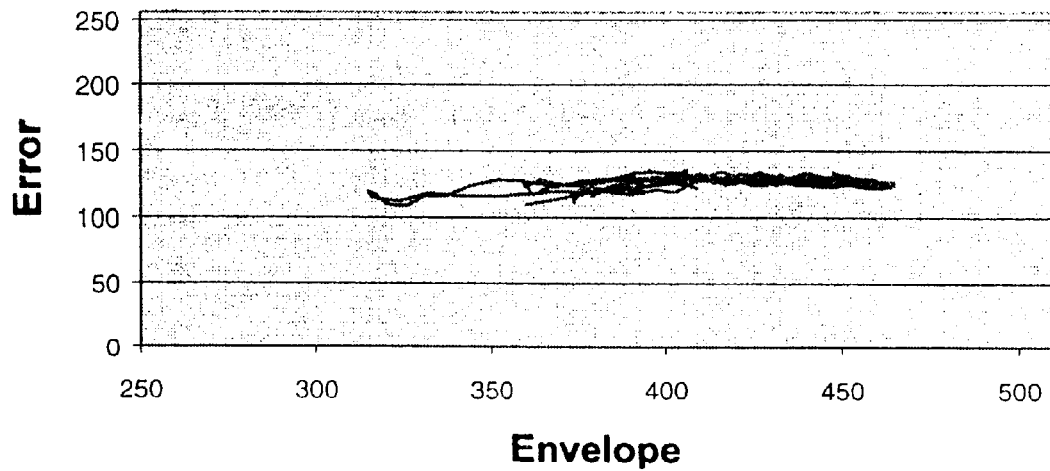

When a further pre-distortion is applied to the envelope of the input signal by including the linear function processor (713) as implemented in FIG. 5 the result is the phase and magnitude errors vs envelope plot shown in FIG. 3c. It can be seen that the loops in the magnitude errors have been greatly reduced as compared to FIG. 3b, thereby reducing the overall level of errors. FIG. 4b shows the improvement in ACP. The top line in FIG. 4b shows the spectral splash in the adjacent channels before the power amplifier has been corrected for any distortion and the bottom line in FIG. 4b shows the spectral splash in the adjacent channels after the power amplifier has been corrected for non-linear instantaneous distortion and linear memory related distortion. The ACP of the lower channel has been improved by around 11.5 dB and the ACP of the higher channel has been improved by around 13.5 dB. Thus, the addition of the linear memory related pre-distortion has provided an improvement in ACP of about 8 dB.

Figure 6:
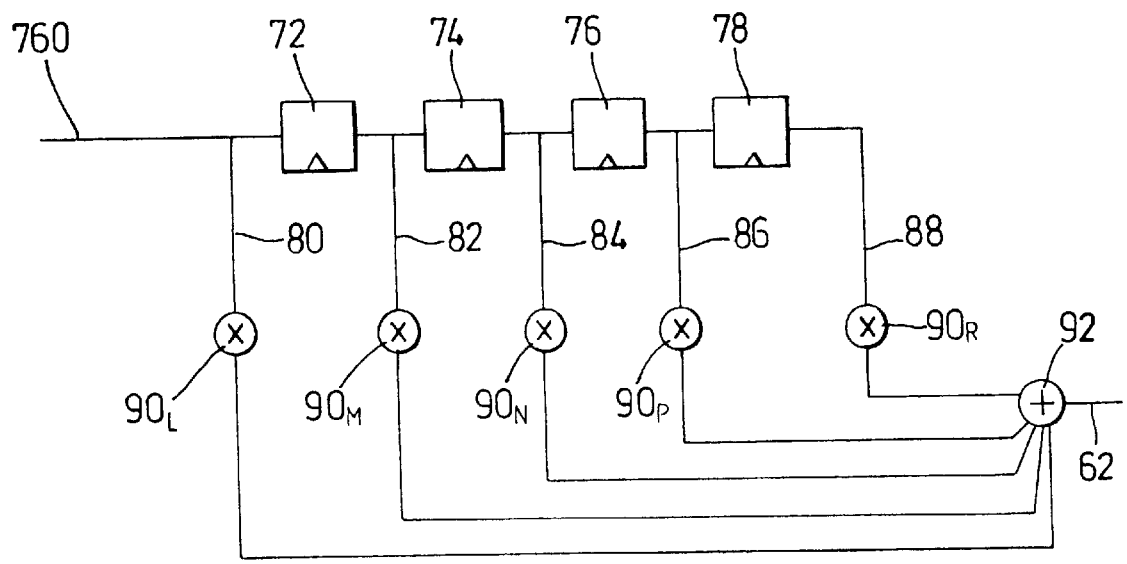
FIG. 6 shows a second implementation of a linear function processor to compensate for memory dependent distortion effects.

As an alternative to the circuits shown in FIG. 5 the linear function processors (713, 715) could be finite impulse response (FIR) filter circuits of the type shown in FIG. 6 to give a pre-distortion function g(t) of the form:

$$g(t)=L|x(t)|+M|x(t-1)|+N|x(t-2)|+P|x(t-3)|+R|x(t-4)|$$

where L, M, N, P and R are scaling factors.

In FIG. 6, there are delay lines (72, 74, 76, 78) each delaying the input to them by one clock cycle. The envelope (80) and the four successively delayed signals (82, 84, 86, 88) are multiplied by a respective scaling factor L, M, N, P, R at respective tap multipliers ($90_L$ to $90_R$), before being added at adder (92) to generate the output g(t) at (62). The output (62) is then added to the magnitude output of the LUT (711) by adder (721) as shown in FIG. 2.

The circuit in FIG. 6 can be generalised to be of the following form:

$$g(t) = \sum_{K=0}^{N} h(k)|x(t-k)|$$

where g(t) is the output of the linear function processor at time t h(k) are the values of the multipliers

|x(t−k)| are the delayed input samples

N is the number of taps

The arrangement of FIG. 5 is a simplified form of the arrangement of FIG. 6 in which multiplier $90_N$ has a scaling factor of 16, multiplier $90_P$ has a scaling factor of −16 and all other multipliers have a scaling factor of 0. The relatively simple circuit of FIG. 5 can be fitted into the remaining space in the CPLD while still providing significant improvement to the linearisation of the power amplifier (22).

The implementations of FIGS. 5 and 6 could equally be used for phase correction in linear function processor (715), for a power amplifier that exhibits memory dependent phase distortion.

According to a further aspect of the present invention the pre-distortion may be adaptive. FIG. 7 shows a further embodiment of the present invention in which the pre-distortion is adaptive with like parts labelled with the same numerals as used in FIG. 2. In the FIG. 7 arrangement the sampled RF output from the directional coupler (12) is applied to a power splitter (32), the outputs of which are connected to the envelope detector (34) (cf. FIG. 2) and a delay line (40). As in FIG. 2, one output (36) of the power splitter (32) is connected to a pre-distortion sub-system (70) which in FIG. 7 is adaptive.

The circuit of FIG. 7 includes an error detection sub-system (60) which requires as an input a sample (42) of the input signal (10) and a sample (54) of the output signal (28), normalised and aligned in time. Output sample (54) is normalised to the same level as (42) by attenuating the coupled output of the coupler (26) in attenuator (52). Input sample (42) is time aligned with (54) by delaying one output of the power splitter (32) in delay line (40).

Figure 8:
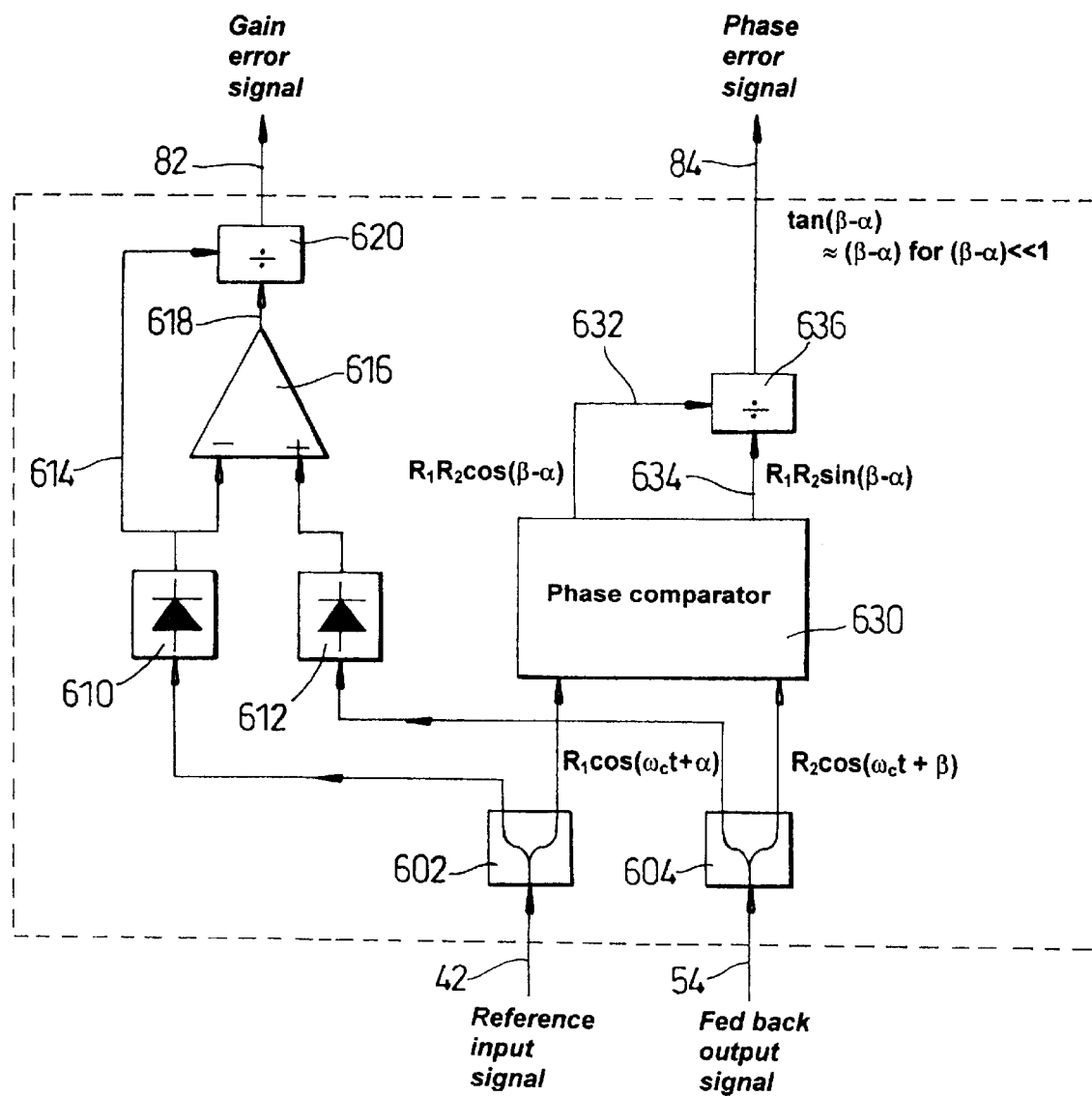
FIG. 8 shows the error detection sub-system of the arrangement of FIG. 7.

FIG. 8 shows an implementation of error detection sub-system (60) shown in FIG. 7. The input signals (42) and (54) are each split by power splitters (602) and (604) respectively. An output of splitter (602) is fed to envelope detector (610) and an output of splitter (604) is fed to envelope detector (612). The envelope detectors (610, 612) produce output voltages proportional to the amplitude envelope of signals (42) and (54) respectively. The output voltage of detector (610) is subtracted from the output voltage of detector (612) by a differential amplifier (616) to produce a signal (618) proportional to the amplitude error between (42) and (54). The difference signal (618) is divided in analogue divider block (620) by signal (614) being the output of envelope detector (610) to produce a signal (82) which is proportional to the amplitude error between (42) and (54).

The remaining outputs of the splitters (602, 604) are fed to a phase comparator (630) which has two outputs (362) and (364). If the RF input from splitter (602) is represented in polar form as $R_1 \cdot \cos(\omega_a t + \alpha)$ and the RF input from splitter (604) is represented as $R_2 \cdot \cos(\omega_c t + \beta)$ then output (632) is proportional to $R_1 \cdot R_2 \cdot \cos(\beta - \alpha)$ and output (634) is proportional to $R_1 \cdot R_2 \cdot \sin(\beta - \alpha)$. Analogue divider block (636) divides output (634), by output (632) to give a phase error signal (84) equal to $\tan(\beta - \alpha)$ which for small $(\beta - \alpha)$ is approximately proportional to $(\beta - \alpha)$.

In order to compensate for changes in the high power amplifier (22) gain and phase characteristic, for example due to temperature or channel frequency changes the pre-distortion sub-system (70) adaptively adjusts its gains and phase transfer functions in response to residual gain error (82) and residual phase error (84) signals fed back from the error detection sub-system (60) as described in the applicant's U.S. patent application Ser. No. 09/209,386 filed on Dec. 10, 1998.

The linear function processors (713) and/or (715) of the pre-distortion sub-system (70) could similarly be made adaptive, ie. responsive to the respective magnitude and phase outputs (82, 84) of the error detection sub-system (60). The measured errors (82, 84) would be read into a digital signal processor (DSP). The DSP would then apply an algorithm to the error signals (82, 84) and in accordance with the results of the algorithm would alter the scaling factors (L, M, N, P, R, etc) of the tap multipliers ($90_L$ to $90_R$, etc) in order to minimise the spread of errors. Various algorithms are possible to determine the beat values and one is described below.

As an example, when the linear function processors are implemented as FIR filters, as shown in FIG. 6, the adaptive pre-distortion of the linear function correction signals could be implemented as follows.

Figure 9:
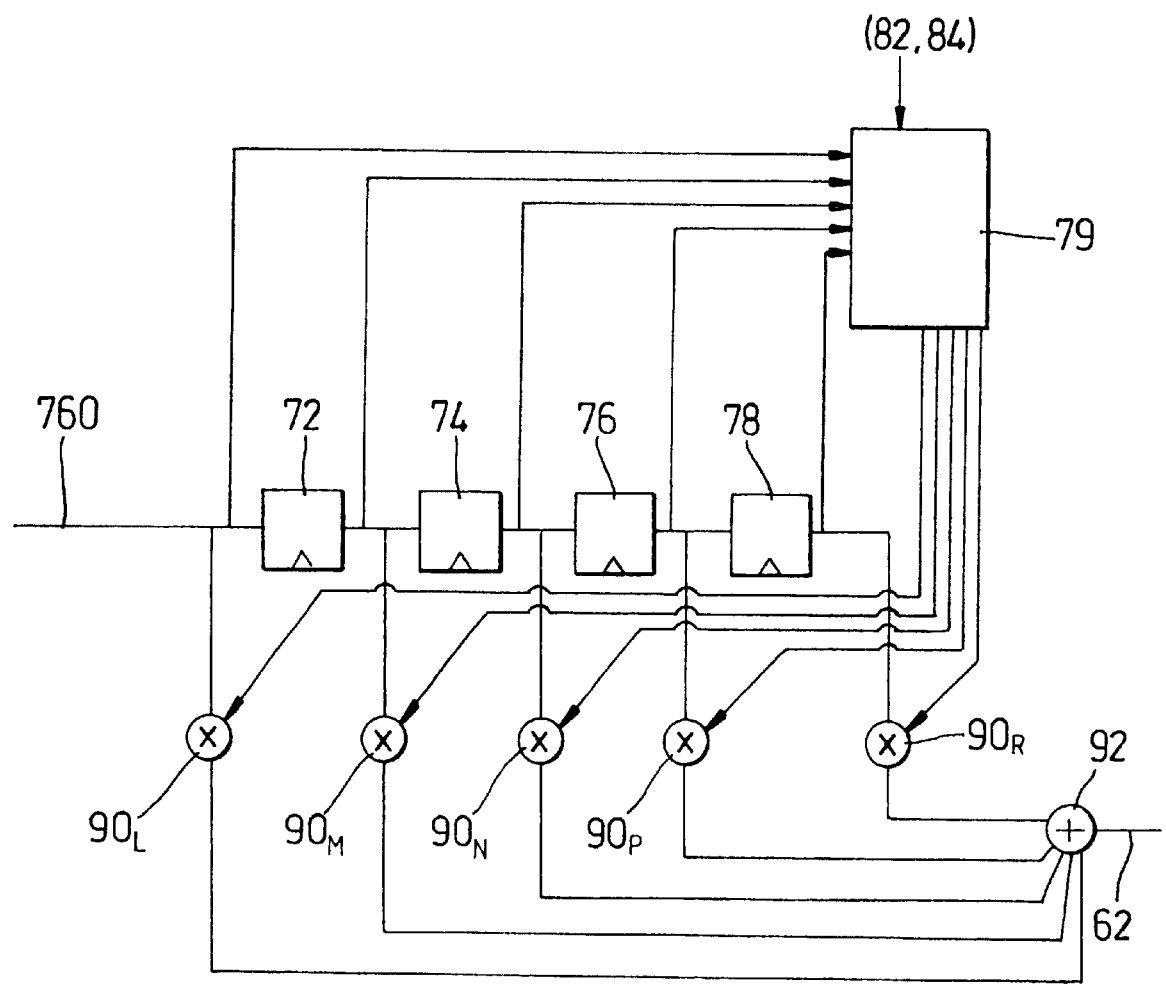
FIG. 9 shows an implementation of an adaptive linear function processor to compensate for memory dependent distortion effects.

Referring to FIGS. 2 and 7 and to the adaptive filter arrangement of FIG. 9 in which like parts to FIG. 6 are identified by like numerals, the adaptive filter of FIG. 9 is initially set so that all the scaling factors (L, M, N, P, R) are set to zero, so that the filter has a zero response. The LUT (711) is then adaptively adjusted to generate optimum memoryless non-linear function correction signals (717, 719). The adjustment of the LUT (711) is then frozen. At this point the amplitude and phase error signals (82, 84) are due solely to residual amplitude and phase variation in the amplifier (22) due to memory effects. These error signals (82, 84) can this be used to adjust the scaling factors in the FIR filters.

Firstly, the amplitude FIR filter (713) is adjusted. Assuming that the filter has N+1 multiplier coefficients (or scaling factors) $h_a(0)$ to $h_a(N)$ which are used to multiply a set of M+1 successively delayed samples of the envelope signal (36). Note that N may be greater than M. The M+1 samples of the envelope signal and an equivalent set of M+1 delayed amplitude error signals (82) are input into a digital signal processor (DSP) (79). The multiplier coefficients are then updated according to the following algorithm which is implemented in the DSP (79):

$|x(n)|$ for n=0 to M is the sequence of captured successively delayed input envelope samples, $e_a(n)$ for n=0 to M is the sequence of captured amplitude error signals $$h_a(k) \rightarrow h_a(k) - \mu_a \cdot e_a(n) \cdot |x(n-k)| \text{ for } k=0 \text{ to } N \text{ and for } n=0 \text{ to } M$$

where $\mu_a$ is a small convergence coefficient.

The new set of multiplier coefficients are fed from the DSP (79) to the multipliers (90) of filter (713) as shown in FIG. 9. Then a fresh set of envelope $|x(n)|$ samples and error $e_a(n)$ samples are fed into the DSP (79) and the process is repeated. This process is iterated until the multiplier coefficients of the filter (713) have converged to final values. The point of convergence may be defined by a fixed number of iterations known to be sufficient. Alternatively, the multiplier coefficients may he monitored by a suitable metric to terminate the iterations when no further change is detected. Once the amplitude filter (713) has converged, the multiplier coefficients $h_a(k)$ are frozen.

The phase filter (715) of the type shown in FIG. 9 can be adjusted by an equivalent process. Once this has been done the initial adaptation of the filters (713) and (715) is complete. Small variations in the response of the amplifier (22) with temperature, power supply and time may result in a deterioration of the effectiveness of the pre-distortion. This may be countered by performing further iterations of the LUT (711) and amplitude and phase linear filters (713, 715) at each clock cycle or on a periodic basis. In order to ensure system stability, it is advisable to only adapt one of these three system elements (the LUT (711), the amplitude filter (713), the phase filter (715) at a time, taking the three system elements n turn.

What is claimed is:

1. An amplifier arrangement comprising:
   an amplifier for amplifying an input radio frequency (RF) signal to generate an output RF signal, said input RF signal being subjected to delay prior to being amplified; and a pre-distortion circuit for generating a correction signal, said pre-distortion circuit comprising:
a linear function processor which generates a linear function correction signal as a function of previous samples of the input RF signal; and
a pre-distortion processor for distorting the delayed input RF signal in accordance with the linear function correction signal in order to compensate for amplifier generated distortion in the output RF signal,
wherein the linear function processor comprises:
a first delay line for delaying the input signal by one cycle;
a subtractor for subtracting the delayed input signal from an undelayed input signal;
second and third delay lines for each delaying the subtracted signal by one cycle; and
a multiplier for multiplying the subtracted signal by a scaling factor.

2. An arrangement according to claim 1 wherein the linear function has the form:

$$g(t) = \sum_{K=0}^{N} h(k)|x(t-k)|$$

where
g(t) is the linear function,
h(k) is a scaling factor,
|x(t–k)| are the previous samples of the input signal, and
N is the number of previous samples.

3. An arrangement according to claim 1 wherein the linear function processor is a finite impulse response filter.

4. An arrangement according to claim 1 wherein the linear function has the form:

$$h(t)=K\{|x(t-2)|-|x(t-3)|\}$$

where
h(t) is the linear function,
K is a scaling factor,
|x(t–2)| is the sample of the input signal two samples before the current input signal, and
|x(t–3)| is the sample of are input signal three samples before the current input signal.

5. An arrangement according to claim 1 wherein the linear function processor is an amplitude linear function processor for generating an amplitude linear function correction signal to compensate for amplitude distortion in the amplifier and the pre-distortion processor generates an amplitude correction signal in accordance with the amplitude linear function correction signal and amplitude modulates the input signal with the correction signal.

6. An arrangement according to claim 1 wherein the linear function processor is a phase linear function processor for generating a phase linear function correction signal to compensate for phase distortion in the amplifier and the pre-distortion processor generates a phase correction signal in accordance with the phase linear function correction signal and phase modulates the input signal with the correction signal.

7. An arrangement according to claim 1 wherein the linear function processor comprises an amplitude linear function processor for generating an amplitude linear function correction signal to compensate for amplitude distortion in the amplifier and a phase linear function processor for generating a phase linear function correction signal to compensate for phase distortion in the amplifier and the pre-distortion processor generates an amplitude correction signal in accordance with the amplitude linear function correction signal, generates a phase correction signal in accordance with the phase linear function correction signal, amplitude modulates the input signal with the amplitude correction signal and phase modulates the input signal with the phase correction signals.

8. A arrangement according to claim 1 wherein the linear function processor comprises:
a plurality of delay lines arranged in a series for delaying the input signal successively by one cycle;
a plurality of multipliers for multiplying by a scaling factor a respective one of a plurality of tapped signals, selected from the input signal and the outputs of any one of the delay lines; and
an adder for adding the outputs from the multipliers.

9. An arrangement according to claim 1 wherein the linear function processor is a digital processor.

10. An amplifier arrangement comprising:
an amplifier for amplifying an input radio frequency (RF) signal to generate an output RF signal, said input RF signal being subjected to delay prior to being amplified; and
a pre-distortion circuit for generating a correction signal, said pre-distortion circuit comprising:
a non-linear function processor which generates a non-linear function correction signal as a function of a sample of the current input RF signal;
a linear function processor which generates a linear function correction signal as a function of previous samples of the input RF signal; and
a pre-distortion processor for distorting the delayed input RF signal in accordance with the non-linear function correction signal and the linear function correction signals in order to compensate for amplifier generated distortion in the output signal,
wherein the linear function processor comprises:
a first delay line for delaying the input signal by one cycle;
a subtractor for subtracting the delayed input signal from an undelayed input signal;
second and third delay lines for each delaying the subtracted signal by one cycle; and
a multiplier for multiplying the subtracted signal by a scaling factor.

11. An arrangement according to claim 10 wherein the non-linear function processor is implemented as a look-up table.

12. An arrangement according to claim 10 wherein the pre-distortion processor distorts the input signal in accordance with a sum of the linear function correction signal and the non-linear function correction signal.

13. An arrangement according to claim 10 wherein the non-linear function processor generates an amplitude non-linear function correction signal for compensating for amplitude distortion and a phase nonlinear function correction signal for compensating for phase distortion.

14. An arrangement according to claim 10 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples.

15. An arrangement according to claim 10 wherein the linear function processor is a finite impulse response filter.

16. An arrangement according to claim 10 wherein the linear function has the form:

$$h(t)=K\{|x(t-2)|x(t-3)|\}$$

where h(t) is the linear function,

K is a scaling factor,

|x(t−2)| is the sample of the input signal two samples before the current input signal, and

|x(t−3)| is the sample of the input signal three samples before the current input signal.

17. An arrangement according to claim 10 wherein the linear function processor is an amplitude linear function processor fox generating an amplitude linear function correction signal to compensate for amplitude distortion in the amplifier and the non-linear function processor generates an amplitude non-linear function correction signal to compensate for amplitude distortion in the amplifier and the pre-distortion processor generates an amplitude correction signal in accordance with the amplitude linear and non-linear correction signals and amplitude modulates the input signal with the correction signal.

18. An arrangement according to claim 10 wherein the linear function processor is a phase linear function processor for generating a phase linear function correction signal to compensate for phase distortion in the amplifier and the non-linear function processor generates a phase non-linear function correction signal to compensate for phase distortion in the amplifier and the pre-distortion processor generates a phase correction signal in accordance with the phase linear and non-linear function correction signals and phase modulates the input signal with the phase correction signal.

19. An arrangement according to claim 10 wherein;

the linear function processor comprises an amplitude linear function processor for generating an amplitude linear function correction signal to compensate for amplitude distortion in the amplifier and a phase linear function processor for generating a phase linear function correction signal to compensate for phase distortion in the amplifier;

the non-linear function processor comprises an amplitude non-linear function processor for generating an amplitude non-linear function correction signal to compensate for amplitude distortion in the amplifier and a phase non-linear function processor for generating a phase non-linear function correction signal to compensate for phase distortion in the amplifier; and the pre-distortion processor generates an amplitude correction signal in accordance with the amplitude linear and non-linear function correction signals, generates a phase correction signal in accordance with the phase linear and non-linear function correction signals, amplitude modulates the input signal with the amplitude correction signal and phase modulates the input signal with the phase correction signal.

20. An arrangement according to claim 1 wherein the linear function processor and the non-linear function processor are digital processors.

21. An arrangement according to claim 10 wherein the linear function processor comprises:

a plurality of delay lines arranged in a series for delaying the input signal successively by one cycle;

a plurality of multipliers for multiplying by a scaling factor a respective one of a plurality of tapped signals, selected from the input signal and the outputs of any one of the delay lines; and an adder for adding the outputs from the tap multipliers.

22. A method of linearising an amplifier for amplifying an input radio frequency (RF) signal to generate an output RF signal, said input RF signal being subjected to delay prior to being amplified, said method comprising the steps of:

generating a linear function correction signal which is a linear function of previous samples of the input RF signal; and distorting the delayed input RF signal in accordance with the linear function correction signal in order to compensate for amplifier generated distortion in the output RF signal, wherein the step of generating linear function correction signal comprises the steps of:

delaying the input signal by one cycle;

subtracting the delayed input signal from an undelayed input signal;

twice delaying the subtracted signal by one cycle; and multiplying the subtracted signal by a scaling factor.

23. A method according to claim 22 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples.

24. A method according to claim 22 wherein the linear function has the form:

$$h(t)=K\{|x(t-2)|-|x(t-3)|\}$$

where h(t) is the linear function,

K is a scaling factor,

|x(t−2)| is the sample of the input signal two samples before the current Input signal, and

|x(t−3)| is the sample of the input signal three samples before the current input signal.

25. A method according to claim 22 comprising the steps of:

generating an amplitude linear function correction signal to compensate for amplitude distortion in the amplifier;

generating an amplitude correction signal in accordance with the amplitude linear function as correction signal; and amplitude modulating the input signal with the amplitude correction signal.

26. A method according to claim 22 comprising the steps of:

generating a phase linear function correction signal to compensate for phase distortion in the amplifier;

generating a phase correction signal in accordance with the phase linear function correction signal; and phase modulating the input signal with the phase correction signal.

27. A method according to claim 22 comprising the steps of:

generating an amplitude linear function correction signal to compensate for amplitude distortion in the amplifier;

generating a phase linear function correction signal to compensate for phase distortion in the amplifier;

generating an amplitude correction signal in accordance with the amplitude linear function correction signal;

generating a phase correction signal in accordance with the phase linear function correction signal, amplitude modulating the input signal with the amplitude correction signal; and phase modulating the input signal with the phase correction signal.

28. A method according to claim 22 wherein the generation of the linear function correction signal comprises the steps of:

generating a plurality of delayed input signals successively delayed by one cycle;

multiplying each delayed input signal by a scaling factor; and adding the plurality of multiplied delayed signals.

29. A method according to claim 22 carried out in the digital domain.

30. A method of linearising an amplifier for amplifying an input radio frequency (RF) signal to generate an output RF signal, said input RF signal being subjected to delay prior to being amplified, said method comprising the steps of;

generating a linear function correction signal which is a linear function of previous samples of the input RF signal;

generating a non-linear function correction signal which is a non-linear function of the input RF signal; and distorting the delayed input RF signal in accordance with the linear and non-linear function correction signals in order to compensate for amplifier generated distortion in the output RF signal, wherein the step of generating the linear function correction signal, comprises:

delaying the input signal by one cycle;

subtracting the delayed input signal from an undelayed input signal;

twice more delaying the subtracted signal each time by one cycle; and multiplying the subtracted signal by a scaling factor.

31. A method according to claim 30 wherein the non-linear function processor is implemented as a look-up table.

32. A method according to claim 30, comprising the step of pre-distorting the input signal in accordance with a sum of the linear function and the non-linear function correction signals.

33. A method according to claim 30 comprising the steps of;

generating a non-linear function correction signal for compensating for amplitude distortion; and generating a non-linear function correction signal for compensating for phase distortion.

34. A method according to claim 30 wherein the linear function has the form.

$$g(t) = \sum_{K=0}^{N} h(k)|x(t-k)|$$

where g(t) is the linear function, h(k) is a scaling factor,

|x(t-k)| are the previous samples of the input signal, and

N is the number of previous samples.

35. An arrangement according to claim 30 wherein the linear function has the form:

$$h(t)=K\{|x(t-2)|-|x(t-3)|\}$$

where h(t) is the linear function

K is a scaling factor

|x(t-2)| is the sample of the input signal two samples before the current input signal

|x(t-3)| is the sample of the input signal three samples before the current input signal.

36. An arrangement according to claim 30, comprising the steps of:

generating an amplitude linear function correction signal to compensate for amplitude distortion in the amplifier;

generating an amplitude non-linear function correction signal to compensate for amplitude distortion in the amplified;

generating an amplitude correction signal in accordance with the amplitude linear and non-linear function correction signals; and amplitude modulating the input signal with the amplitude correction signal.

37. A method according to claim 30, comprising the steps of:

generating a phase linear function correction signal to compensate for phase distortion in the amplifier.

generating a phase non-linear function correction signal to compensate for phase distortion in the amplifier;

generating a phase correction signal in accordance with the phase linear and non-linear function correction signals; and phase modulating the input signal with the phase correction signal.

38. A method according to claim 30 comprising the steps of:

generating an amplitude linear function correction signal to compensate for amplitude distortion in the amplifier;

generating a phase linear function correction signal to compensate for phase distortion in the amplifier;

generating an amplitude non-linear function correction signal to compensate for amplitude distortion in the amplifier;

generating a phase non-linear function correction signal to compensate for phase distortion in the amplifier;

generating an amplitude correction signal in accordance with the amplitude linear and non-linear function correction signals;

generating a phase correction signal in accordance with the phase linear and non-linear function correction signals;

amplitude modulating the input signal with the amplitude correction signal; and phase modulating the input signal with the phase correction signal.

39. A method according to claim 30 wherein generating the linear function correction signal comprises the steps of:

generating a plurality of successively delayed signals;

multiplying by a scaling factor each delayed signal; and adding the delayed multiplied signals.

40. A method according to claim 30 carried out in the digital domain.

41. An amplifier arrangement comprising:

an amplifier for amplifying an input radio frequency (RF) signal to generate an output RF signal, said input RF signal being subjected to delay prior to being amplified;

an error detection processor responsive to the input RF signal and the output RF signal for generating an error correction signal which represents a difference between the input and output RF signals due to amplifier generated distortion;

an adaptive linear function processor responsive to the error correction signal for implementing a linear function of previous samples of the input RF signal to generate a linear function correction signal; and a pre-distortion processor for distorting the delayed input RF signal in accordance with the linear function correction signal in order to compensate for said amplifier generated distortion in the output RF signal, wherein the linear function processor comprises:

a plurality of delay lines arranged in a series for delaying the input signal successively by one cycle;

a plurality of multipliers responsive to the error correction signal from the error correction processor for multiplying by a scaling factor a respective one of a plurality of tapped signals, selected from the input signal and the outputs of any one of the delay lines; and an adder for adding the outputs from the multipliers, and the arrangement additionally comprises a digital signal processor for generating the scaling factors in response to the error correction signal in accordance with a means squared error form of adaptation.

42. An arrangement according to claim 41 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples, and the arrangement additionally comprises a digital signal processor for generating the scaling factors h(k) in response to the error correction signal in accordance with a means squared error form of adaptation.

43. An arrangement according to claim 41 wherein the linear function processor is a finite impulse response filter and additionally comprises a digital signal processor for generating scaling factors h(k) for the filter in response to the error correction signal in accordance with a means squared error form of adaptation.

44. An arrangement according to claim 41 wherein the linear function processor is an amplitude linear function processor for generating an amplitude linear function correction signal in response to an amplitude error correction signal which represents a difference between the amplitude envelope of the input and output signals due to distortion in the amplifier and the pre-distortion processor generates an amplitude correction signal in accordance with the amplitude linear function correction signal and amplitude modulates the input signal with the correction signal.

45. An arrangement according to claim 41 wherein the linear function processor is a phase linear function processor for generating a phase linear function correction signal in response to a phase error correction signal which represents a difference between the phase of the input and output signals due to distortion in the amplifier and the pre-distortion processor generates a phase correction signal in accordance with the, phase linear function correction signal and phase modulates the input signal with the correction signal.

46. An arrangement according to claim 41 wherein the linear function processor comprises an amplitude linear function processor for generating an amplitude linear function correction signal in response to an amplitude error correction signal which represents a difference between the amplitude envelopes of the input and output signals due to distortion in the amplifier for generating an amplitude linear function correction signal and a phase linear function processor for generating a phase linear function correction signal in response to a phase error correction signal which represents a difference between the phase of the input and output signals due to distortion in the amplifier and the pre-distortion processor generates an amplitude correction signal in accordance with the amplitude linear function correction signal, generates a phase correction signal in accordance with the phase linear function correction signal, amplitude modulates the input signal with the amplitude correction signal and phase modulates the input signal with the phase correction signals.

47. An amplifier arrangement comprising:

an amplifier for amplifying an input radio frequency (RF) signal to generate an output RF signal, said input RF signal being subjected to delay prior to being amplified;

an error detection processor responsive to the input RF signal and the output RF signal for generating an error correction signal which represents a difference between the input and output RF signals due to amplifier generated distortion;

an adaptive linear function processor responsive to the error correction signal for generating a linear function correction signal which is a linear function of previous samples of the input RF signal;

a non-linear function processor for generating a non-linear function which is a non-linear function of the input RF signal; and a pre-distortion processor for distorting the delayed input RF signal in accordance with the linear and non-linear correction signals in order to compensate for said amplifier generated distortion in the output RF signal, wherein the linear function processor comprises:

a plurality of delay lines arranged in a series for delaying the input signal successively by one cycle;

a plurality of for multiplying by a scaling factor generated in response to the error correction signal a respective one of a plurality of tapped signals, selected from the input signal and the outputs of any one of the delay lines; and an adder for adding the outputs from the tap multipliers and the arrangement additionally comprises a digital signal processor for generating the scaling factors in response to the error correction signal in accordance with a means square error form of adaptation.

48. An arrangement according to claim 47 wherein the non-linear function processor is implemented as a look-up table.

49. An arrangement according to claim 47 wherein the pre-distortion processor distorts the input signal in accordance with a sum of the linear function correction signal and the non-linear function correction signal.

50. An arrangement according to claim 47 wherein the non-linear function processor generates an amplitude non-linear function correction signal for compensating for amplitude distortion and a phase non-linear function correction signal for compensating for phase distortion.

51. An arrangement according to claim 47 wherein the linear function has the form;

$$g(t) = \sum_{K=0}^{N} h(k)|x(t-k)|$$

where
g(t) is the linear function,
h(k) is a scaling factor,
|x(t−k)| are the previous samples of the input signal, and
N is the number of previous samples
and the arrangement additionally comprises a digital signal processor for generating the scaling factors in response to the error correction signal in accordance with a means squared error form of adaptation.

52. An arrangement according to claim 47 wherein the linear function processor is a finite impulse response filter and the arrangement additionally comprising a digital signal processor for generating scaling factors for the filter in response to the error correction signal in accordance with a means squared error form of adaptation.

53. An amplifier arrangement comprising:
an amplifier for amplifying an input radio frequency (RF) signal to generate an output RF signal, said input RF signal being subjected to delay prior to being amplified; and
a pre-distortion circuit for generating a correction signal, said pre-distortion circuit comprising:
a linear function processor which generates a linear function correction signal as a function of previous samples of the input RF signal; and
a pre-distortion processor for distorting the delayed input RF signal in accordance with the linear function correction signal in order to compensate for amplifier generated distortion in the output RF signal,
wherein the linear function processor comprises:
a plurality of delay lines arranged in a series for delaying the input signal successively by one cycle;
a plurality of multipliers for multiplying by a scaling factor a respective one of a plurality of tapped signals, selected from the input signal and the outputs of any one of the delay lines; and
an adder for adding the outputs from the multipliers.

54. An arrangement according to claim 53 wherein the linear function has the form:

$$g(t) = \sum_{K=0}^{N} h(k)|x(t-k)|$$

where
g(t) is the linear function,
h(k) is a scaling factor,
|x(t−k)| are the previous samples of the input signal, and
N is the number of previous samples.

55. An arrangement according to claim 53 wherein the linear function processor is a finite impulse response filter.

56. An arrangement according to claim 53 wherein the linear function has the form:

$$h(t)=K\{|x(t-2)|-|x(t-3)|\}$$

where
h(t) is the linear function,
K is a scaling factor,
|x(t−2)| is the sample of the input signal two samples before the current input signal, and
|x(t−3)| is the sample of the input signal three samples before the current input signal.

57. An arrangement according to claim 55 wherein the linear function processor is an amplitude linear function processor for generating an amplitude linear function correction signal to compensate for amplitude distortion in the amplifier and the pre-distortion processor generates an amplitude correction signal in accordance with the amplitude linear function correction signal and amplitude modulates the input signal with the correction signal.

58. An arrangement according to claim 53 wherein the linear function processor is a phase linear function processor for generating a phase linear function correction signal to compensate for phase distortion in the amplifier and the pre-distortion processor generates a phase correction signal in accordance with the phase linear function correction signal and phase modulates the input signal with the correction signal.

59. An arrangement according to claim 53 wherein the linear function processor comprises an amplitude linear function processor for generating an amplitude linear function correction signal to compensate for amplitude distortion in the amplifier and a phase linear function processor for generating a phase linear function correction signal to compensate for phase distortion in the amplifier and the pre-distortion processor generates an amplitude correction signal in accordance with the amplitude linear function correction signal, generates a phase correction signal in accordance with the phase linear function correction signal, amplitude modulates the input signal with the amplitude correction signal and phase modulates the input signal with the phase correction signals.

60. An amplifier arrangement comprising:
an amplifier for amplifying an input radio frequency (RF) signal to generate an output RF signal, said input RF signal being subjected to delay prior to being amplified; and
a pre-distortion circuit for generating a correction signal, said predistortion circuit comprising:
a non-linear function processor which generates a non-linear function correction signal as a function of a sample of the current input RF signal;

a linear function processor which generates a linear function correction signal as a function of previous samples of the input RF signal; and a pre-distortion processor for distorting the delayed input RF signal in accordance with the non-linear function correction signal and the linear function correction signals in order to compensate for amplifier generated distortion in the output signal, wherein the linear function processor comprises:

a plurality of delay lines arranged in a series for delaying the input signal successively by one cycle;

a plurality of multipliers for multiplying by a scaling factor a respective one of a plurality of tapped signals, selected from the input signal and the outputs of any one of the delay lines; and an adder for adding the outputs from the tap multipliers.

61. An arrangement according to claim 60 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples.

62. An arrangement according to claim 60 wherein the linear function has the form:

$$h(t)=K\{|x(t-2)|-|x(t-3)|\}$$

where h(t) is the linear function,

K is a scaling factor,

|x(t−2)| is the sample of the input signal two samples before the current input signal, and

|x(t−3)| is the sample of the input signal three samples before the current input signal.

63. A method of linearising an amplifier for amplifying an input radio frequency (RF) signal to generate an output RF signal, said input RF signal being subjected to delay prior to being amplified, said method comprising the steps of:

generating a linear function correction signal which is a linear function of previous samples of the input RF signal; and distorting the delayed input RF signal in accordance with the linear function correction signal in order to compensate for amplifier generated distortion in the output RF signal, wherein the step of generating the linear function correction signal comprises the steps of:

generating a plurality of delayed input signals successively delayed by one cycle;

multiplying each delayed input signal by a scaling factor; and adding the plurality of multiplied delayed signals.

64. A method according to claim 63 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples.

65. A method according to claim 63 wherein the linear function has the form:

$$h(t)=K\{|x(t-2)|-|x(t-3)|\}$$

where h(t) is the linear function,

K is a scaling factor,

|x(t−2)| is the sample of the input signal two samples before the current input signal, and

|x(t−3)| is the sample of the input signal three samples before the current input signal.

66. A method of linearising an amplifier for amplifying an input radio frequency (RF) signal to generate an output RF signal, said input RF signal being subjected to delay prior to being amplified, said method comprising the steps of;

generating a linear function correction signal which is a linear function of previous samples of the input RF signal;

generating a non-linear function correction signal which is a non-linear function of the input RF signal; and distorting the delayed input RF signal in accordance with the linear and non-linear function correction signals in order to compensate for amplifier generated distortion in the output RF signal, wherein the step of generating the linear function correction signal comprises the steps of:

generating a plurality of successively delayed signals;

multiplying by a scaling factor each delayed signal; and adding the delayed multiplied signals.

67. A method according to claim 66 wherein the linear function has the form:

$$g(t) = \sum_{K=0}^{N} h(k)|x(t-k)|$$

where g(t) is the linear function, h(k) is a scaling factor,

|x(t−k)| are the previous samples of the input signal, and

N is the number of previous samples.

68. An arrangement according to claim 66 wherein the linear function has the form:

$$h(t)=K\{|x(t-2)|-|x(t-3)|\}$$

where h(t) is the linear function

K is a scaling factor

|x(t−2)| is the sample of the input signal two samples before the current input signal

|x(t−3)| is the sample of the input signal three samples before the current input signal.

* * * * *